US006803154B1

(12) United States Patent
Tanaka

(10) Patent No.: US 6,803,154 B1
(45) Date of Patent: Oct. 12, 2004

(54) TWO-DIMENSIONAL PHASE ELEMENT AND METHOD OF MANUFACTURING THE SAME

(75) Inventor: Ichiro Tanaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 246 days.

(21) Appl. No.: 09/654,038

(22) Filed: Sep. 1, 2000

(30) Foreign Application Priority Data

Sep. 3, 1999 (JP) ............................................. 11/250853

(51) Int. Cl.[7] ............................... G03C 5/00; G03F 9/00
(52) U.S. Cl. ............................................. 430/5; 430/322
(58) Field of Search ............................ 430/5, 322, 394; 428/544

(56) References Cited

U.S. PATENT DOCUMENTS 5,455,116 A * 10/1995 Nagano et al. ............. 428/545
5,487,963 A * 1/1996 Sugawara ...................... 430/5
6,475,704 B1 11/2002 Iwasaki et al. ............. 430/321
6,569,608 B2 5/2003 Tanaka et al. ............. 430/394
2002/0187431 A1 12/2002 Tanaka et al. ............. 430/321

FOREIGN PATENT DOCUMENTS

| JP | 11-160510 | 6/1999 |
| JP | 20000-098116 | 4/2000 |
| JP | 2000-221660 | 8/2000 |
| JP | 2000-304913 | 11/2000 |

* cited by examiner

Primary Examiner—S. Rosasco
(74) Attorney, Agent, or Firm—Fitzpatrick, Cella, Harper & Scinto

(57) ABSTRACT

Disclosed is a method of manufacturing a two-dimensional phase type element, which includes the steps of forming, on a substrate, a first etching mask in a checkered pattern, forming segments of multiple levels at a portion not covered by the first mask, forming a second etching mask corresponding to an inversion of the first etching mask, removing the first etching mask, and forming segments of multiple levels at a portion not covered by the second etching mask.

14 Claims, 15 Drawing Sheets

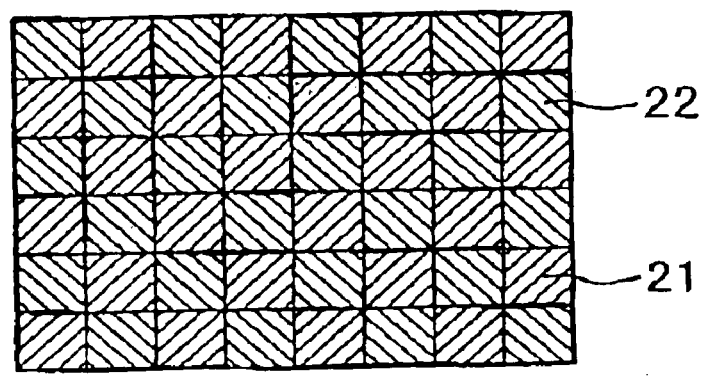
FIG. 1
FIG. 2
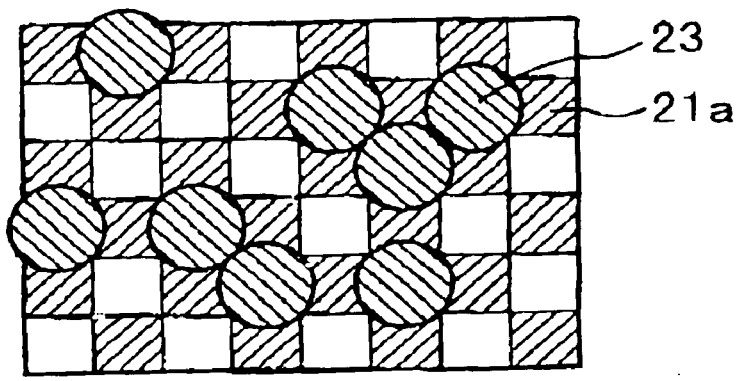
FIG. 3

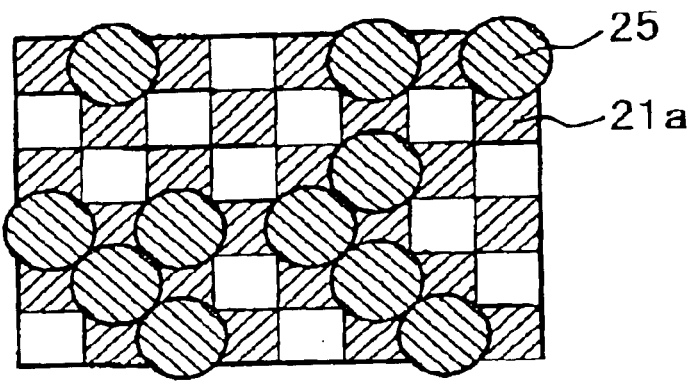
FIG. 7
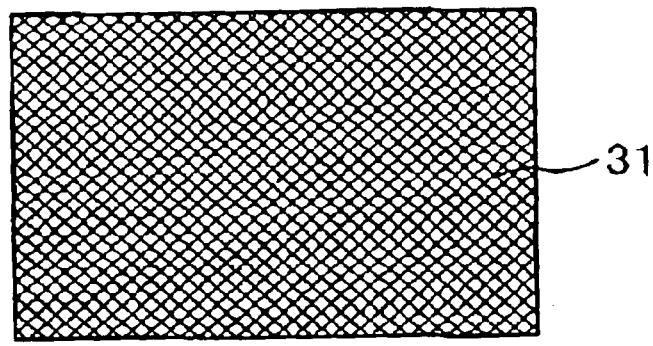
FIG. 8
FIG. 9

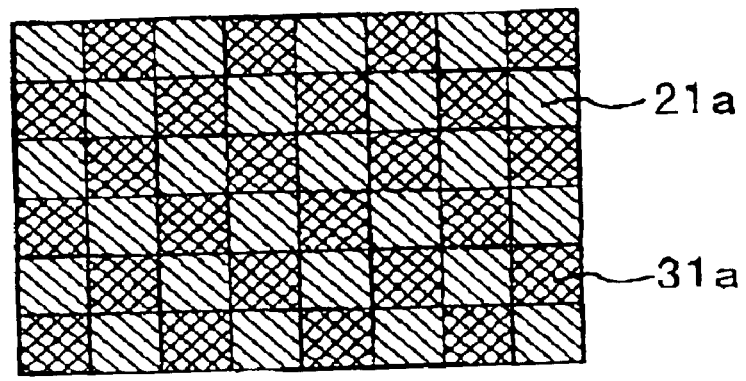
FIG. 10
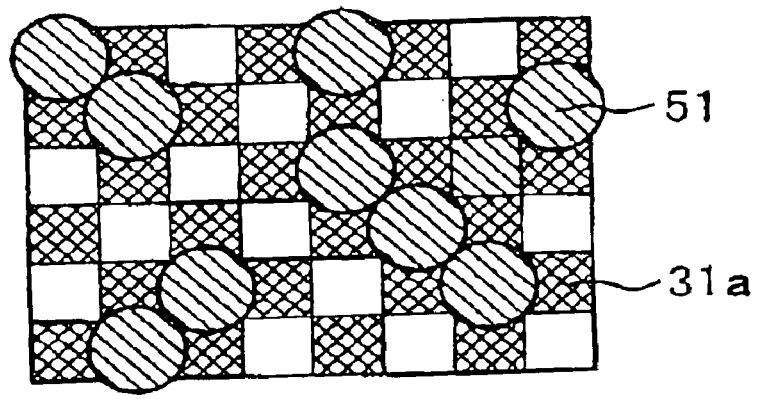
FIG. 11
| 0 | 61 | 61 | 427 | 0 | 183 | 61 | 183 |
|---|---|---|---|---|---|---|---|
| 427 | 0 | 427 | 61 | 244 | 61 | 244 | 0 |
| 61 | 366 | 61 | 427 | 0 | 61 | 61 | 427 |
| 0 | 61 | 61 | 61 | 122 | 0 | 305 | 61 |
| 61 | 183 | 0 | 305 | 61 | 0 | 0 | 427 |
| 366 | 0 | 122 | 61 | 427 | 0 | 183 | 0 |
FIG. 12

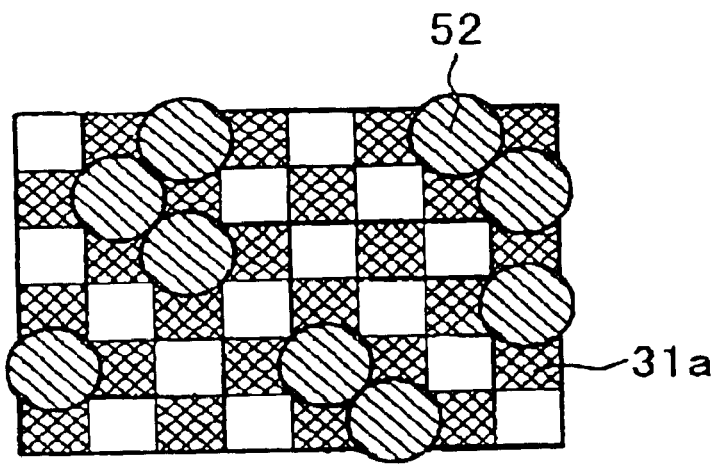
FIG. 13
|  |  |  |  |  |  |  |
|---|---|---|---|---|---|---|
| 122 | 61 | 61 | 427 | 122 | 183 | 61 | 183 |
| 427 | 0 | 427 | 183 | 244 | 183 | 244 | 0 |
| 183 | 366 | 61 | 427 | 122 | 61 | 183 | 427 |
| 0 | 61 | 61 | 183 | 122 | 122 | 305 | 61 |
| 61 | 183 | 122 | 305 | 183 | 0 | 122 | 427 |
| 366 | 122 | 122 | 183 | 427 | 0 | 183 | 0 |
FIG. 14
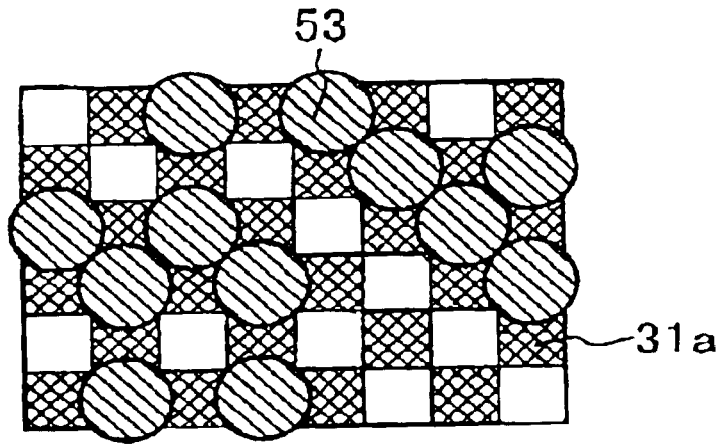
FIG. 15

| 0 | 61 | 0 | 0 |
|---|---|---|---|
| 0 | 0 | 61 | 61 |
| 61 | 61 | 0 | 0 |
| 0 | 0 | 0 | 61 |

FIG. 25A

| 122 | 183 | 122 | 0 |
|---|---|---|---|
| 0 | 122 | 61 | 183 |
| 183 | 61 | 122 | 0 |
| 0 | 122 | 0 | 183 |

FIG. 25B

| 122 | 183 | 122 | 0 |
|---|---|---|---|
| 244 | 366 | 305 | 427 |
| 427 | 61 | 122 | 244 |
| 0 | 122 | 244 | 183 |

FIG. 25C

TWO-DIMENSIONAL PHASE ELEMENT AND METHOD OF MANUFACTURING THE SAME

FIELD OF THE INVENTION AND RELATED ART

This invention relates to a two-dimensional phase element such as a phase type computer generated hologram (CGH), a two-dimensional binary structure or a phase modulation plate, for example, usable as an optical component of a semiconductor manufacturing reduction exposure apparatus or a component of an optical interconnection element, for example. In another aspect, the invention concerns a method of manufacturing a mold for such two-dimensional element.

A paper "O plus E" No.11, pp95–100 (1996) discloses a method of manufacturing a step-like shape on a substrate, through repetition of resist application, resist mask patterning and etching. If the number of masks is L, a multiple level phase type CGH having a phase level of $2^L$ is obtainable. FIGS. 24A–24C are plan views of reticles to be used for photolithography, in the manufacture of a phase type CGH. More specifically, FIGS. 24A, 24B and 24C show patterns of reticles 1$a$, 1$b$ and 1$c$, respectively. Zones depicted by hatching are light blocking regions. The reticle 1$a$ is used to perform an etching to a depth 61 nm. The reticle 1$b$ is used to perform an etching to a depth 122 nm. The reticle 1$c$ is used to perform an etching to a depth 244 nm. These reticles 1$a$, 1$b$ and 1$c$ may be used in any order. However, a higher resist patterning precision is attainable if the etching is started in an order from a smaller etching-depth reticle, that is, the reticle 1$a$.

First, a resist material is applied to a substrate, and the resist is then patterned by using the reticle 1$a$ shown in FIG. 24A. The thus produced resist pattern is then used as a mask, and an etching process is carried out to a depth 61 nm. The result is an etching depth distribution such as shown in FIG. 25A. Numerals in the drawing denote the etching depth (nm). Thereafter, the resist pattern is separated, and a resist is again applied to the substrate. Then, the resist patterning is carried out by using the reticle 1$b$ shown in FIG. 24B. The thus produced resist pattern is used as a mask, and an etching process is carried out to a depth 122 nm, whereby an etching depth distribution such as shown in FIG. 25B is produced. Subsequently, the resist pattern is separated, and a resist is applied again to the substrate. The resist is then patterned by using the reticle 1$c$ shown in FIG. 24C. The thus produced resist pattern is used as a mask, and an etching process is carried out to a depth 244 nm, whereby an etching depth distribution such as shown in FIG. 25C is produced.

In the photolithographic procedure described above, alignment of reticles is necessary. For manufacture of a multiple level phase type CGH,c idealistically a shape such as shown in FIG. 26 should be formed. Practically, however, there occurs an alignment error which causes an unwanted error at the edge of the shape, as shown in the sectional view of FIG. 27.

FIG. 28 is a plan view of a segment in a case where, due to an alignment error, a second-time resist pattern of a size "a" at each side is deviated in X direction by a length "d". Zones 11 depict the boundaries of segments defined by a first-time resist pattern. Zone 12 depicted by a thick solid line denotes the second-time resist pattern. Thus, zones 13 depicted by hatching are invalid regions as a phase type CGH, and the area $S_1$ of the invalid regions can be given by:

$$S_1 = 2ad \quad (1)$$

FIG. 29 is a plan view of a segment in a case where, due to an alignment error, a second-time resist pattern is deviated in x and Y directions by a length "d". Zones 11 defined by narrow lines depict the boundaries of segments defined by a first-time resist pattern. Zone 14 depicted by a thick line denotes the second-time resist pattern. Thus, zones 15 depicted with hatching are invalid regions as a phase type CGH. The area $S_2$ thereof can be given by:

$$S_2 = 4ad - 2d^2 \quad (2)$$

On the other hand, where a phase type CGH manufactured in accordance with the method described above is incorporated into an illumination system, since the phase type CGH has invalid regions, light may be projected to an undesired position or the quality of an image formed by the phase type CGH may be deteriorated. Therefore, a desired performance may not be accomplished.

Where such an illumination system is incorporated into a projection exposure apparatus, a desired performance may of course be unattainable. Also, where a semiconductor device is manufactured by use of such a projection exposure apparatus, the yield rate may be lowered and the device productivity may be slowed down. It may cause an increased device price.

SUMMARY OF THE INVENTION

It is accordingly an object of the present invention to provide a two-dimensional phase type element and a method of manufacturing the same, by which a desired performance can be accomplished stably.

In accordance with an aspect of the present invention, there is provided a two-dimensional phase type element having plural segments, wherein an alignment error between segments is limited to a local portion.

In accordance with another aspect of the present invention, there is provided a method of manufacturing a two-dimensional phase type element, comprising the steps of: forming, on a substrate, a first etching mask in a checkered pattern; and performing an etching process while using the mask as a reference.

In accordance with a further aspect of the present invention, there is provided a method of manufacturing a two-dimensional phase type element, comprising the steps of: forming, on a substrate, a first etching mask in a checkered pattern; forming segments of multiple levels at a portion not covered by the first mask; forming a second etching mask corresponding to an inversion of the first etching mask; removing the first etching mask; and forming segments of multiple levels at a portion not covered by the second etching mask.

In the methods described above, the first etching mask may be formed by a chromium film.

The first etching mask may consist of aluminum.

The first etching mask may consist of aluminum and the second etching mask may consist of chromium.

The first etching mask may consist of chromium and the second etching mask may consist of aluminum.

The substrate may contain quartz.

A reticle having an optical proximity effect correcting pattern may be used to form the etching mask of checkered pattern through photolithography.

The etching process may be carried out by use of the etching mask and an etching mask formed by a resist.

The method may further comprise molding an element while using, as a mold, a substrate on which plural segments of multiple levels are formed.

The method may be usable to produce one of a phase type computer generated hologram, a two-dimensional binary structure, and a phase modulation plate.

In accordance with a further aspect of the present invention, there is provided an illumination system including a two-dimensional phase type element manufactured in accordance with a method as recited above.

In accordance with a yet further aspect of the present invention, there is provided a projection exposure apparatus having an illumination system as recited above.

In accordance with a still further aspect of the present invention, there is provided a device manufacturing method, comprising the steps of: exposing a wafer to a device pattern, by use of a projection exposure apparatus as recited above; and developing the exposed wafer.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic view for explaining a resist pattern formed on a substrate in an embodiment of the present invention.

FIG. 2 is a schematic view for explaining an etching depth distribution defined on a substrate in an embodiment of the present invention.

FIG. 3 is a schematic view for explaining a resist pattern formed on a substrate in an embodiment of the present invention.

FIG. 7 is a schematic view for explaining a resist pattern formed an a substrate in an embodiment of the present invention.

FIG. 8 is a schematic view for explaining an etching depth distribution defined on a substrate in an embodiment of the present invention.

FIG. 9 is a schematic view of a substrate having an aluminum film formed thereon, in accordance with an embodiment of the present invention.

FIG. 10 is a schematic view of a substrate having an aluminum film formed thereon and being polished by a predetermined amount.

FIG. 11 is a schematic view for explaining a resist pattern formed on a substrate in an embodiment of the present invention.

FIG. 12 is a schematic view for explaining an etching depth distribution defined on a substrate in an embodiment of the present invention.

FIG. 13 is a schematic view for explaining a resist pattern formed on a substrate in an embodiment of the present invention.

FIG. 14 is a schematic view for explaining an etching depth distribution defined on a substrate in an embodiment of the present invention.

FIG. 15 is a schematic view for explaining a resist pattern formed on a substrate in an embodiment of the present invention.

FIGS. 25A–25C are schematic views of etching depth distributions, respectively.

DESCRIPTION OF THE PREFERRED EMBODIMENTS

Figures 4, 5, 6:
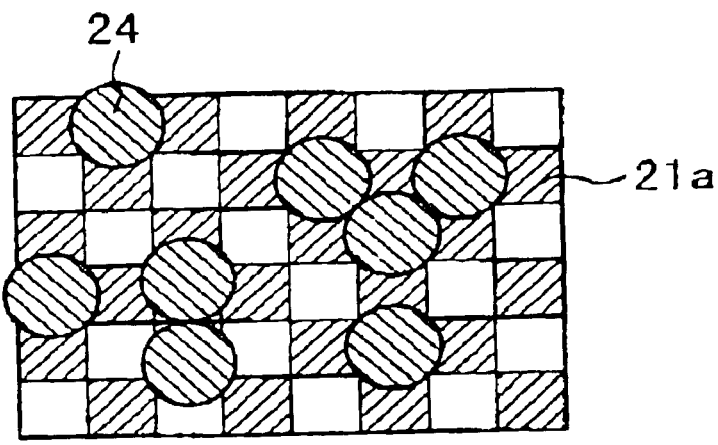
FIG. 4 is a schematic view for explaining an etching depth distribution defined on a substrate in an embodiment of the present invention.
FIG. 5 is a schematic view for explaining a resist pattern formed on a substrate in an embodiment of the present invention.
FIG. 6 is a schematic view for explaining an etching depth distribution defined on a substrate in an embodiment of the present invention.

Preferred embodiments of the present invention will now be described with reference to FIGS. 1–23 of the accompanying drawings.

Referring to FIG. 1, first, a chromium film 21 is formed on a quartz substrate with a thickness of about 100 nm. Then, a photoresist is applied onto the chromium film 21 and, through photolithography, a resist pattern 22 is formed thereon in a checkered pattern and with a width 1 micron, as an etching mask.

In this embodiment, quartz is used as a base material of the substrate. However, fluoride such as calcium fluoride, magnesium fluoride, lithium fluoride, aluminum fluoride or the like may be used. Use of fluoride is particularly effective as a material of a phase type CGH or a phase modulation plate to be used in an exposure apparatus which uses exposure light of short wavelength such as ArF excimer laser light or $F_2$ (fluorine) excimer laser light, for example. Also, use of quartz is effective as a material of a phase type CGH or a phase modulation plate to be used in an exposure apparatus which uses ArF excimer laser light, KrF excimer laser light, or i-line light from a ultra-high pressure Hg lamp, for example. Further, the formation of the resist pattern 22 may use any one of a stepper, an EB patterning apparatus or an ion patterning apparatus.

FIGS. 2, 4, 6, 8, 12 and 14 show etching depth distributions at each segment of a substrate. In the state shown in FIG. 2, the etching process is not yet performed. Thus, all the etching depths of the segments of the substrate are zero (nm).

Subsequently, while using the resist pattern 22 (FIG. 1) as a mask, the chromium film 21 is etched in accordance with a parallel flat plate RIE method and by using a mixture gas of chlorine and oxygen, for example, whereby a chromium film pattern is produced. The etching process may be done, in place of using the RIE method, on the basis of a sputter etching method, an ion milling method (best suited to a case where a fluoride series material is used), a low-pressure high-density plasma method such as UHF method or an ICP method, for example.

Subsequently, the resist pattern 22 is peeled, by which a chromium film pattern 21a such as shown in FIG. 3 is obtained. Then, a photoresist is again applied thereto, and a resist pattern 23 is formed thereon through photolithography. While the resist pattern 23 is illustrated as having circular shapes with a diameter corresponding to the length of a diagonal of the segment, it may have square shapes with a size (at each side) corresponding to the diagonal length of the segment.

Thereafter, while using the chromium film pattern 21a and the resist pattern 23 as a mask, the quartz substrate is etched to a depth 61 nm in accordance with the RIE method. FIG. 4 shows the etching depth (nm) distribution at the segments of the quartz substrate, after the first-time etching process.

Subsequently, the resist pattern 23 is separated and, thereafter, a photoresist is again applied to the substrate. Then, through photolithography, a resist pattern 24 such as shown in FIG. 5 is formed. Although the resist pattern 24 has circular shapes similar to the resist pattern 23, it may have square shapes with a size (at each side) corresponding to the diagonal length of the segment. Subsequently, while using the chromium film pattern 21a and the resist pattern 24 as a mask, the quartz substrate is etched to a depth 122 nm in accordance with the RIE method. FIG. 6 shows the etching depth (nm) distribution at the segments of the quartz substrate, after the second-time etching process.

Then, the resist pattern 24 is separated and, thereafter, a photoresist is again applied to the substrate. Then, through photolithography, a resist pattern 25 such as shown in FIG. 7 is formed. Subsequently, while using the chromium film pattern 21a and the resist pattern 25 as a mask, the substrate is etched to a depth 244 nm in accordance with the RIE method. FIG. 8 shows the etching depth (nm) distribution at the segments of the quartz substrate, after the third-time etching process. While the resist pattern 25 is illustrated as having circular shapes like the resist pattern 23, it may have square shapes.

Subsequently, as shown in FIG. 9, the resist pattern 25 is removed and, in accordance with a sputtering method, an aluminum film 31 with a thickness 100 nm is formed on the whole surface of the substrate. Then, the aluminum film surface is polished until the surface of the chromium pattern 21a is exposed, by using an abrasive material of cerium oxide of a particle diameter 5/100 micron, and an abrasive cloth of urethane sheet, and with use of a lapping device, under a condition of 30 rpm and 50 g/cm².

FIG. 10 is a plan view of the substrate after the polishing. As illustrated, there is produced an alternating arrangement of the chromium film pattern 21a and the aluminum film pattern 31a, wherein each of the chromium film pattern 21a group and the aluminum film pattern 31a group comprises a checkered pattern. Thereafter, the chromium film pattern 21a is removed by wet etching, while using an etching liquid based on a mixture of cerium ammonium nitrate, perchloric acid and water, for example. By removing the chromium film pattern 21a while leaving the aluminum film pattern 31a there, as described above, an aluminum film pattern (31a) having a checkered pattern corresponding to an inverse of the checkered pattern of the chromium film pattern 21a, can be produced.

Subsequently, as shown in FIG. 11, a photoresist is again applied to the substrate and, through photolithography, a resist pattern 51 is formed thereon. While the resist pattern 51 is illustrated as having circular shapes with a diameter corresponding to the diagonal length of the segment, like the resist pattern 23, it may be formed with square shapes with a size (at each side) corresponding to the diagonal length of the segment.

Then, while using the aluminum film pattern 31a and the photoresist pattern 51 as a mask, the quartz substrate is etched to a depth 61 nm, in accordance with the RIE method. FIG. 12 shows the etching depth distribution at the segments of the quartz substrate, after the first-time etching.

Subsequently, the resist pattern 51 is separated and, thereafter, a photoresist is again applied to the substrate. Then, through photolithography, a resist pattern 52 such as shown in FIG. 13 is formed. Thereafter, while using the aluminum film pattern 31a and the resist pattern 52 as a mask, the quartz substrate is etched to a depth 122 nm. FIG. 14 shows the etching depth distribution at the segments of the quartz substrate. The resist pattern 52 may have square shapes with a size (at each side) corresponding to the diagonal length of the segment.

Figures 16, 17:
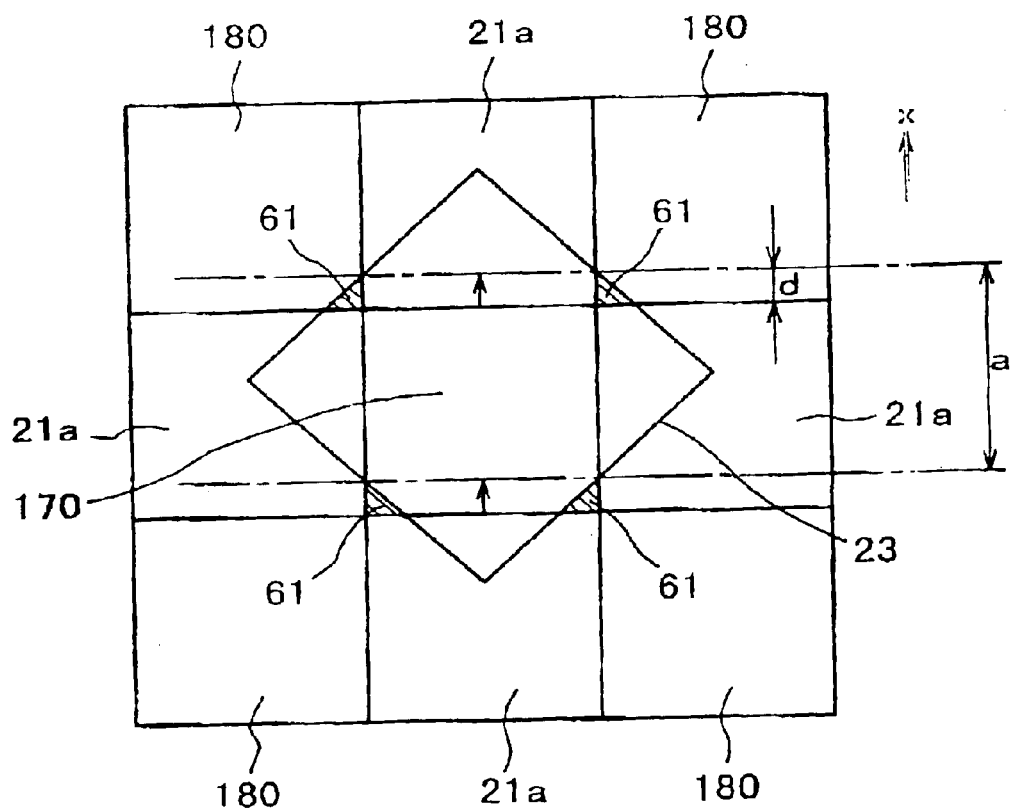
FIG. 16 is a schematic view for explaining an etching depth distribution defined on a substrate in an embodiment of the present invention.
FIG. 17 is a schematic view for explaining invalid regions in a case where a resist pattern in an embodiment of the present invention is deviated.

Subsequently, the resist pattern 52 is separated and, thereafter, a photoresist is again applied to the substrate. Then, through photolithography, a resist pattern 53 such as shown in FIG. 15 is formed. Thereafter, while using the aluminum film pattern 31a and the resist pattern 53 as a mask, the quartz substrate is etched to a depth 244 nm. FIG. 16 shows the etching depth distribution at the segments of the quartz substrate. The resist pattern 53 may have square shapes with a size (at each side) corresponding to the diagonal length of the segment.

Thereafter, the resist pattern 53 is separated and, then, the aluminum film pattern 31a is removed by wet etching, while using a mixture solvent of phosphoric acid, nitric acid, acetic acid and water, for example. By this, a phase type CGH having eight-level stepped structure (eight-level depths) is accomplished.

FIG. 17 is a schematic and plane view for explaining segments in a case where, due to an alignment error, a resist pattern 23 which inherently should cover a central segment 170, is deviated in X direction by an amount corresponding to a length "d". The resist pattern 23 has a square shape with a size (at each side) of $2^{1/2}a$. It is inclined by 45 deg. with respect to the chromium film pattern 21a grid (square shape 21a). Zones denoted at 180 are those segments which should be etched.

Although, in FIGS. 3, 5 and 7, the resist pattern has a circular shape, in FIG. 17 it has a square shape. This is fox simplicity of explanation. Thus, the zones 61 depicted by hatching are invalid regions. Namely, they are limited to local zones. The area $S_3$ thereof can be given by equation (3) below:

$$S_3 = 2d^2 \tag{3}$$

Figure 28:
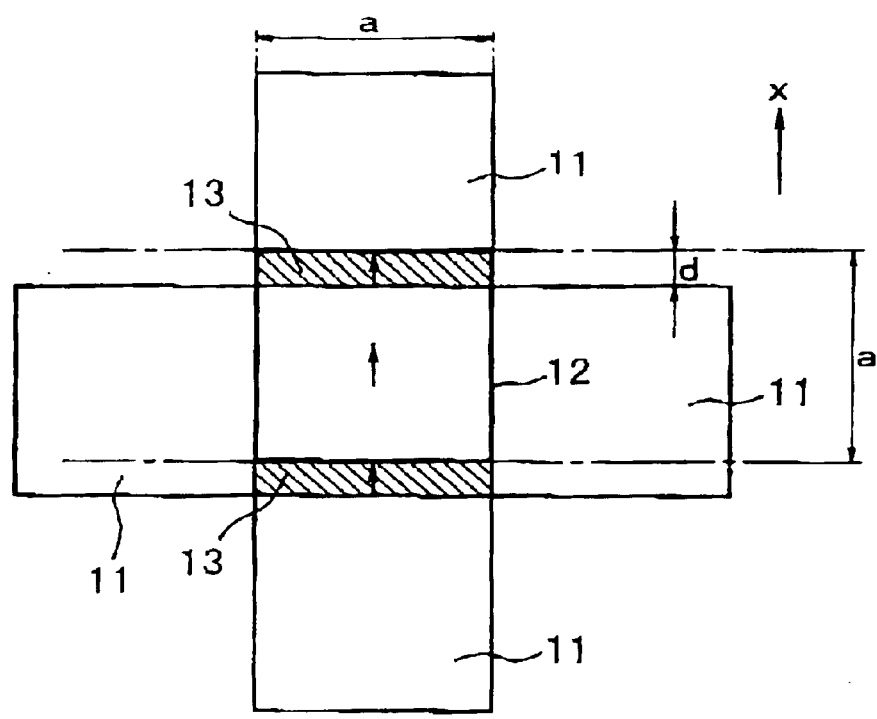
FIG. 28 is a schematic view for explaining invalid regions in a case where a resist pattern is deviated.

It is seen that, as compared with the example of FIG. 28, as long as d<a is satisfied, $S_1 > S_3$ applies.

Since, in the cases of ordinary patterning, the alignment can be accomplished under the condition of d<<a, the resist pattern 23 of this embodiment can be said as narrowing the invalid region, as compared with the resist pattern 12 described hereinbefore.

Figure 18:
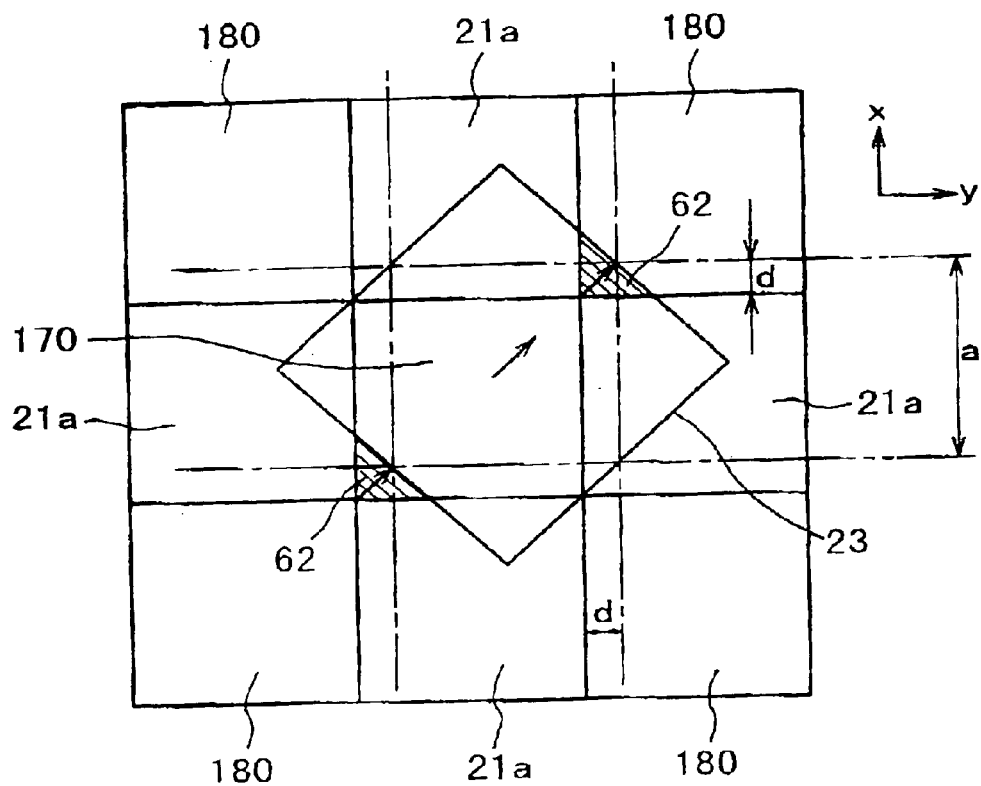
FIG. 18 is a schematic view for explaining invalid regions in a case where a resist pattern in an embodiment of the present invention is deviated.

FIG. 18 is a schematic and plan view of segments in a case where, due to an aliment error, the resist pattern 23 which should cover a central segment is deviated in X and Y directions by an amount corresponding to a length "d", respectively. Like the case of FIG. 17, the resist pattern 23 has a square shape with a size (at each side) of $2^{1/2}a$. It is inclined by 45 deg. with respect to the chromium film pattern 21a grid (square shape 21a). Zones denoted at 180 are those segments to be etched.

Thus, the zones 62 depicted by hatching are invalid regions. Namely, they are limited to local zones. The area $S_4$ thereof can be given by equation (4) below:

$$S_4=4d^2 \qquad (4)$$

Figure 29:
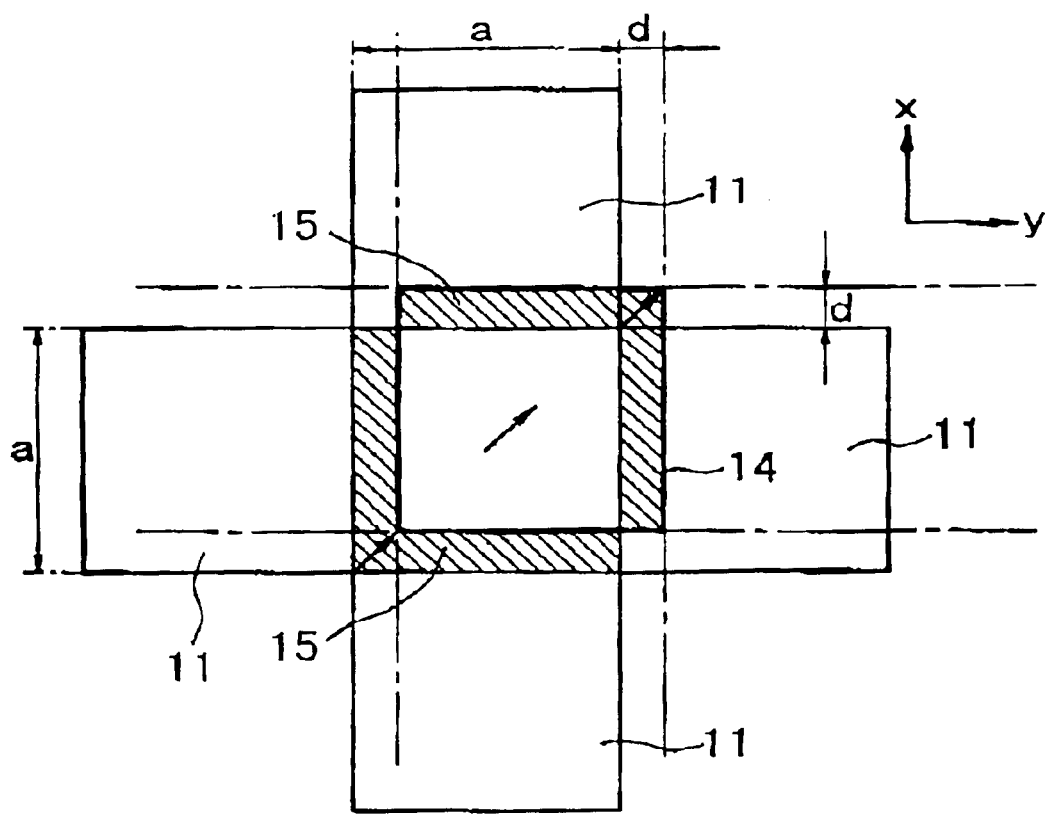
FIG. 29 is a schematic view for explaining invalid regions in another case where a resist pattern is deviated.

It is seen that, as compared with the example of FIG. 29, as long as $d<2a/3$ is satisfied, $S_2>S_4$ applies.

Since, in the cases of ordinary patterning, the alignment can be accomplished under the condition of $d<<a$, the resist pattern 23 of this embodiment can be said as narrowing the invalid region, as compared with the resist pattern 12 described hereinbefore.

While the present embodiment has been compared with the conventional method in respect to two models of FIGS. 17 and 18, even if there occurs an alignment error in any arbitrary direction, the alignment error in the present embodiment results in a narrower invalid region.

Figure 19A:
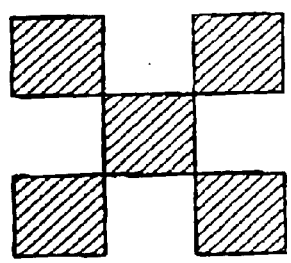
FIGS. 19A–19D are schematic views of reticles and resist patterns, respectively.
Figure 19B:
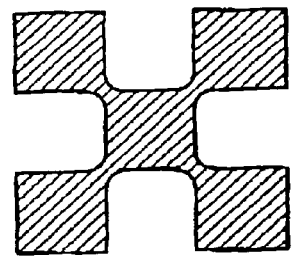

FIG. 19A is a schematic view of a reticle for forming a chromium film pattern having a checkered pattern in the present embodiment. However, a resist pattern formed by use of the reticle shown in FIG. 19A may be such as shown in FIG. 19B. Thus, an accurate chromium film pattern may not be produced.

Figure 19C:
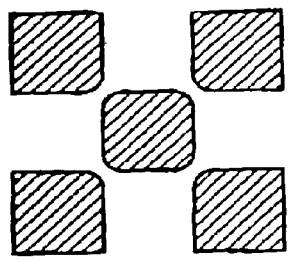
Figure 19D:
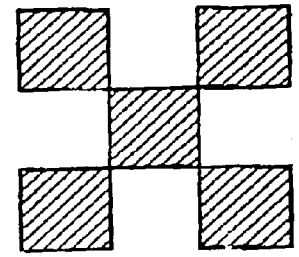

In consideration of it, a reticle based on optical proximity effect correction, such as shown in FIG. 19C, may be used. With this reticle, a resist pattern such as shown in FIG. 19D can be produced. Thus, a chromium film pattern can be produced more accurately.

A phase type CGH, a two-dimensional binary structure or a phase modulation plate may have an anti-reflection film, as required. By using a reflective material for the substrate or, alternatively, by forming a film of reflective material on the substrate in accordance with a vapor deposition method, a plating method, a sputtering method or a CVD method, for example, a reflective phase type CGH or a reflection type two-dimensional binary structure or a reflection type phase modulation plate can be produced. Also, a reflection reinforcing film may be formed on the surface of a reflection type element.

Figure 20A:
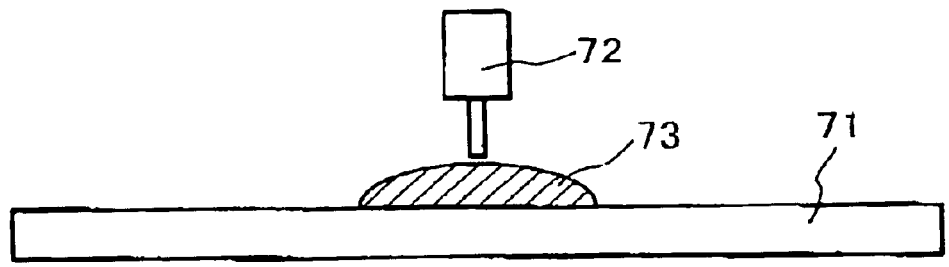
FIGS. 20A–20D are schematic views, respectively, for explaining manufacture of a step-like diffractive optical element.

FIGS. 20A–20D are schematic views, respectively, for explaining the procedure for manufacturing a step-like diffractive optical element. It is seen from these drawings that a phase type CGH having been manufactured in accordance with the embodiment described above, can be used as a mold in production of a resin-made step-like diffractive optical element. More specifically, first, as shown in FIG. 20A, by using a cylinder 72, drops of a resin material 73 such as a reaction-setting type resin, that is, a ultraviolet-ray setting type resin or a thermosetting type resin, of acrylic series or epoxy series, are put on a glass substrate 71.

Figure 20B:
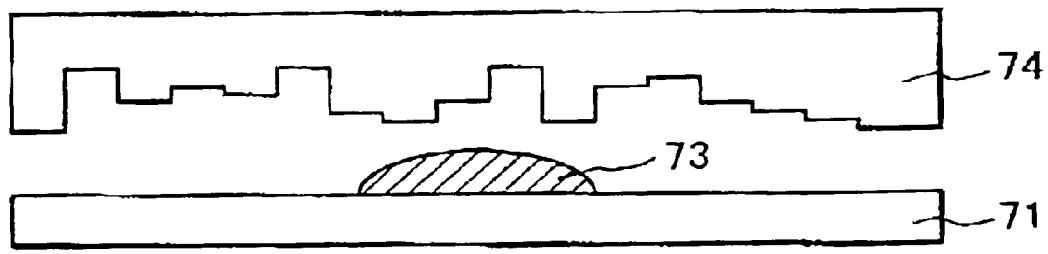
Figure 20C:
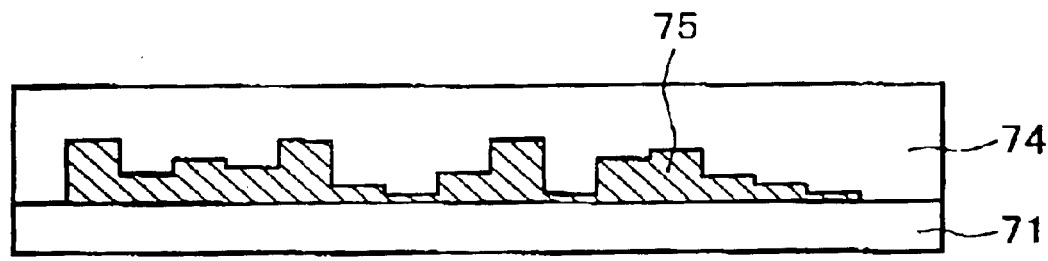

Then, as shown in FIG. 20B, a phase type CGH 74 having been manufactured in accordance with the method of the present embodiment is pressed against the top face of the resin 73 from the above. By this, a replica layer 75 such as shown in FIG. 20C is produced. Here, before pressing the mold (phase type CGH 74) against the resin 73, the surface of the CGH 74 may be coated with a mold releasing agent, as required, to facilitate the mold releasing.

Figure 20D:
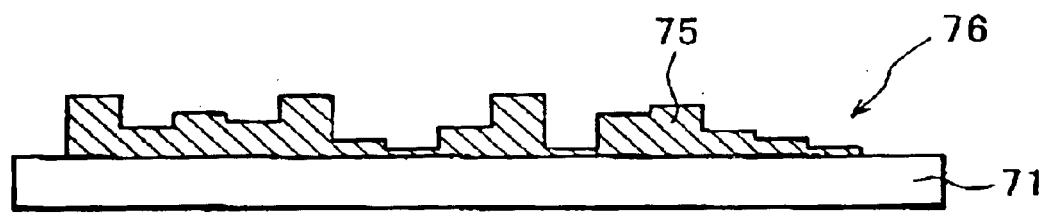

Subsequently, where a ultraviolet-ray setting type resin is used, ultraviolet rays are projected to the resin 73 from the the glass substrate 71 (mold) side to cause setting of the resin 73. Where a thermosetting type resin is used, a heating treatment is carried out to cause setting of the resin 73. Thereafter, the replica layer 75 is separated from the glass substrate 71, whereby a step-like diffractive optical element 76 such as shown in FIG. 20D is accomplished.

Figure 21:
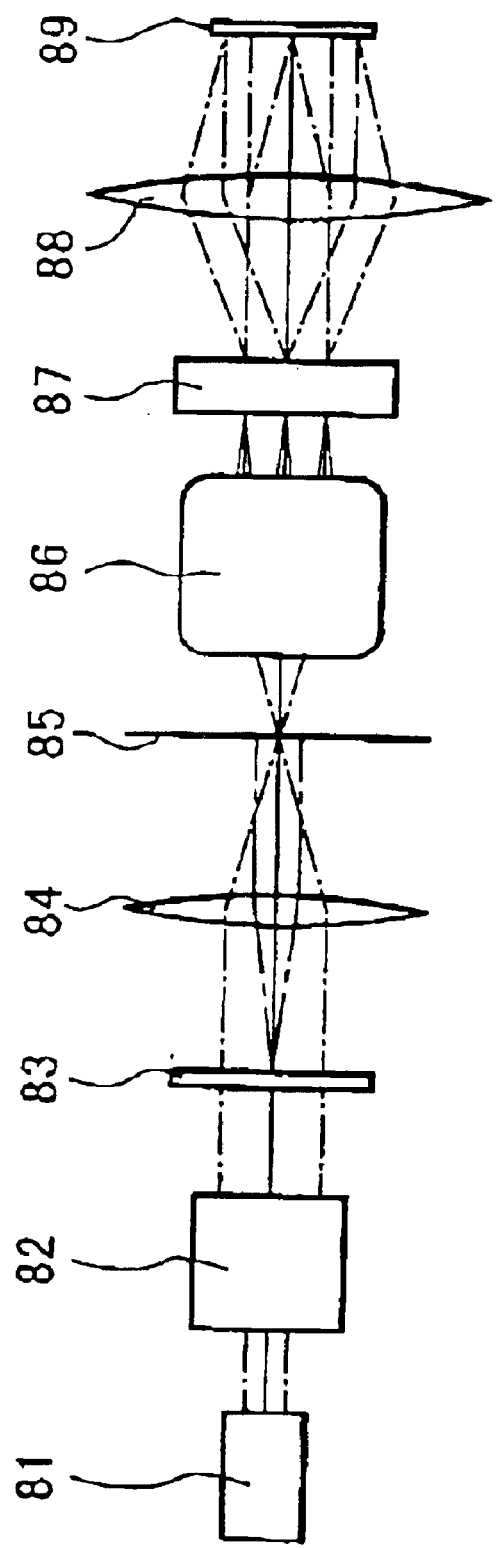
FIG. 21 is a schematic view of an illumination system in a semiconductor exposure apparatus.

FIG. 21 is a schematic view of an illumination system of a semiconductor exposure apparatus for use with exposure light of ultraviolet rays, such as i-line light or KrF excimer laser light, for example, wherein a phase type CGH having been manufactured in accordance with this embodiment is incorporated therein. The light emitted from a light source 81 goes through a beam shaping optical system 82 and impinges on a phase type CGH 83. The light passing through the CGH element 83 goes through a relay lens system 84, a stop 85, a zooming optical system 86, a multiple-beam producing optical system 87, and a projecting means 88, and it it projected on a reticle 89. The reticle 89 has a circuit pattern formed thereon, and the reticle pattern is then projected onto a wafer by means of a projection optical system (not shown).

The phase type CGH 83 has a function for producing light of ring-like shape or quadruple shape at the position of the stop 85. Thus, by using a phase type CGH as manufactured in accordance with the method described hereinbefore, the optical performance as well as the light utilization efficiency in the modified illumination such as ring-like illumination or quadruple illumination, can be improved significantly. Further, where a semiconductor exposure apparatus to be used with ultraviolet exposure light such as i-line light or KrF excimer laser light, for example, is manufactured by using such illumination system, a high-performance semiconductor exposure apparatus can be provided.

Figure 22:
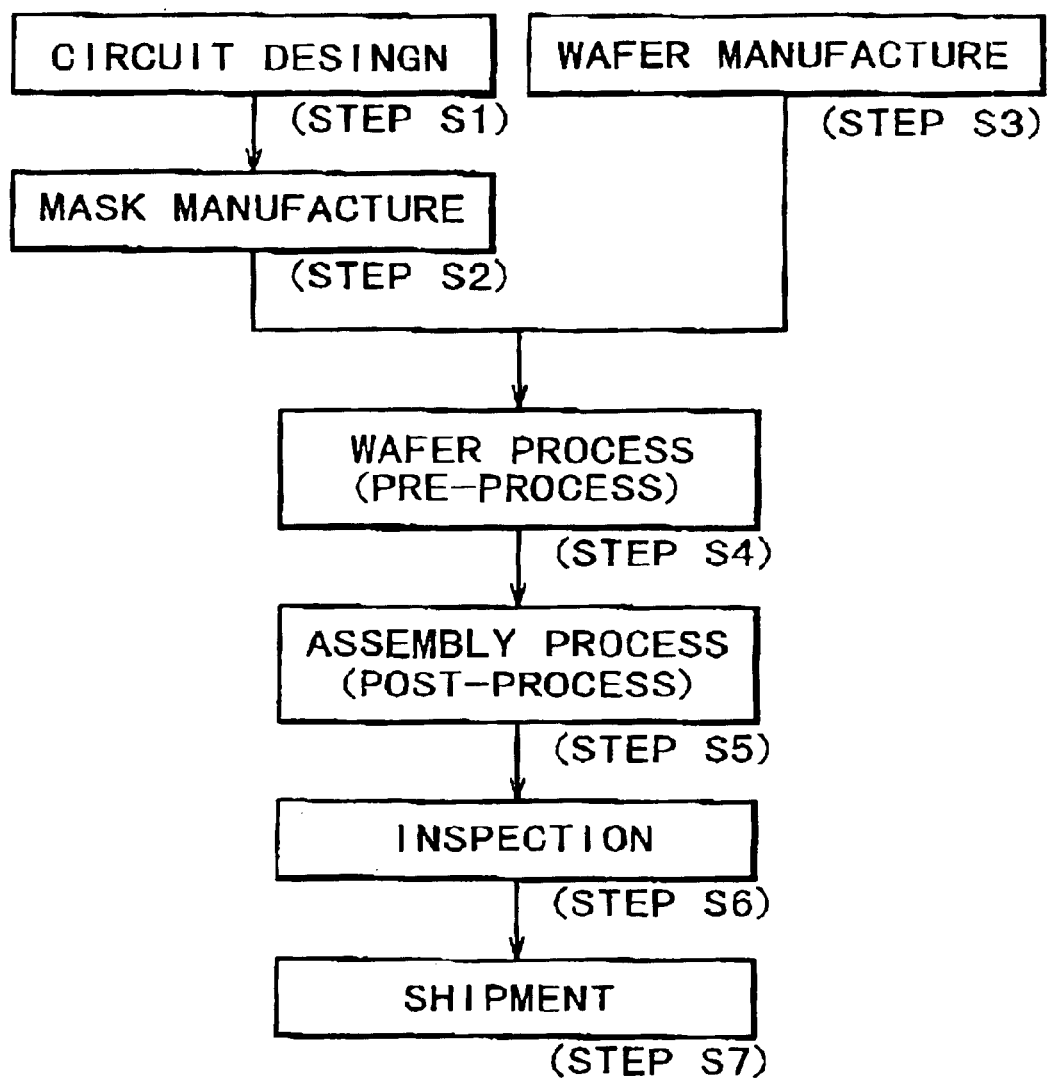
FIG. 22 is a flow chart of semiconductor device manufacturing processes.

FIG. 22 is a flow chart of procedure for manufacture of semiconductor devices such as semiconductor chips (e.g. ICs or LSIs), liquid crystal panels, or CCDs, for example.

Step S1 is a design process for designing a circuit of a semiconductor device. Step S2 is a process for making a mask on the basis of the circuit pattern design, by using an EB patterning apparatus, for example. Step S3 is a process for preparing a wafer by using a material such as silicon. Step S4 is a wafer process (called a pre-process) using the so prepared mask and wafer. The mask is loaded into the exposure apparatus described above, and the mask is conveyed onto a mask chuck, by which the mask is chucked. Then, the wafer is loaded and any alignment deviation is detected. The water stage is driven to perform the alignment. As the alignment is accomplished, the exposure process is carried out. After completion of the exposure, the wafer is moved stepwise to a next shot position, whereby circuits are practically formed on the wafer through lithography. Step S5 subsequent to this is an assembling step (called a post-process) wherein the wafer having been processed by step S4 is formed into semiconductor chips. This step includes an assembling (dicing and bonding) process and a packaging (chip sealing) process. Step S6 is an inspection step wherein operation check, durability check and so on for the semiconductor devices provided by step S5, are carried out. With these processes, semiconductor devices are completed and they are shipped (step S7).

Figure 23:
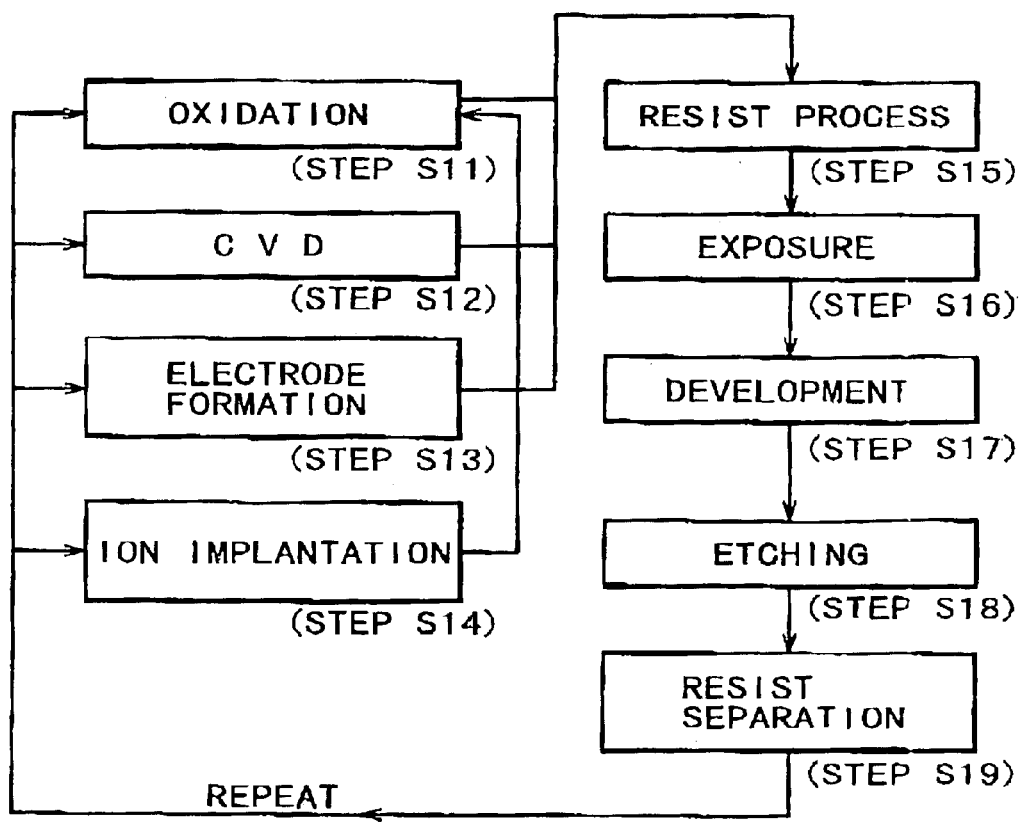
FIG. 23 is a flow chart for explaining details of a wafer process included in the procedure of FIG. 22.
Figure 24A:
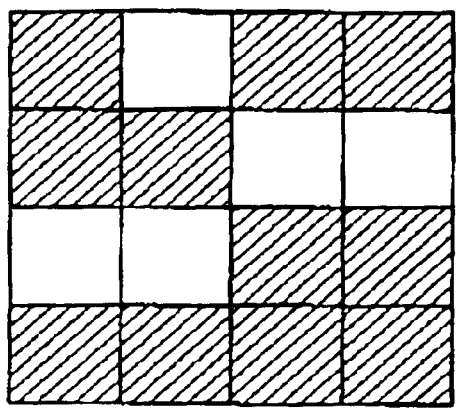
FIGS. 24A–24C are schematic view of reticles, respectively.
Figure 24B:
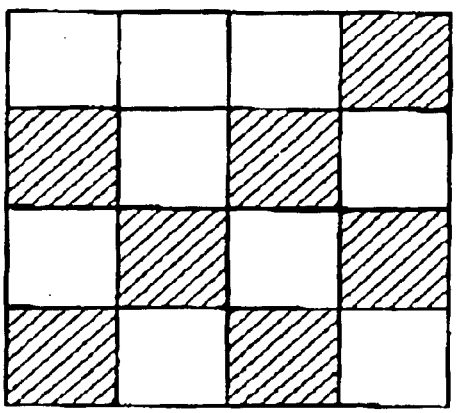
Figure 24C:
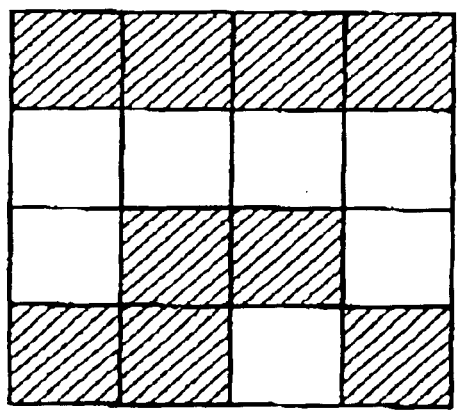
Figure 26:
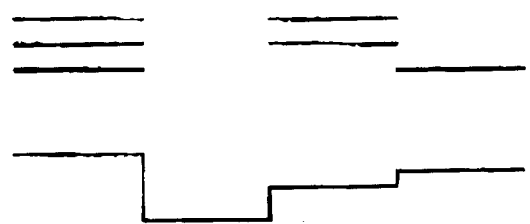
FIG. 26 is a sectional view of a phase type CGH.
Figure 27:
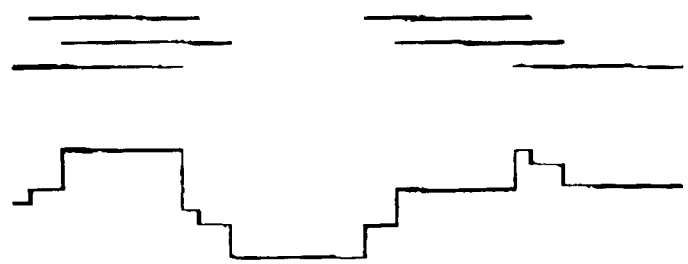
FIG. 27 is a sectional view of a phase type CGH.

FIG. 23 is a flow chart showing details of the wafer process (step S4).

Step S11 is an oxidation process for oxidizing the surface of a wafer. Step S12 is a CVD process for forming an insulating film on the wafer surface. Step S13 is an electrode forming process for forming electrodes upon the wafer by vapor deposition. Step S14 is an ion implanting process for implanting ions to the wafer. Step S15 is a resist process for applying a resist (photosensitive material) to the wafer. Step S16 is an exposure process for printing, by exposure, the circuit pattern of the mask on the wafer through the exposure apparatus described above.

Step S17 is a developing process for developing the exposed wafer. Step S18 is an etching process for removing portions other than the developed resist image. Step S19 is a resist separation process for separating the resist material remaining on the wafer after being subjected to the etching process. By repeating these processes, circuit patterns are superposedly formed on the wafer.

With these processes, high density microdevices can be manufactured.

As described hereinbefore, in accordance with the method of manufacturing a two-dimensional phase type element, a resist pattern (as a second etching mask to be used in combination with a first etching mask of checkered pattern) is formed with a circular shape having a diameter corresponding to a diagonal length of a segment or a square shape having a size (at each side) corresponding to the diagonal length of the segment. This enables that an alignment error is limited to a local portion. As a result, a phase type CGH, a two-dimensional binary structure or a phase modulation plate can be produced more accurately as compared with the conventional method, such that the optical performance of the element can be improved.

While the invention has been described with reference to the structures disclosed herein, it is not confined to the details set forth and this application is intended to cover such modifications or changes as may come within the purposes of the improvements or the scope of the following claims.

What is claimed is:

1. A method of manufacturing a two-dimensional phase element comprising the steps of:
   forming a first etching mask in a checkered pattern on a substrate; and
   performing an etching process by using the first etching mask.

2. A method according to claim 1, wherein the etching process is carried out by use of the first etching mask and another etching mask which is formed by a resist.

3. A method of manufacturing a two-dimensional phase element comprising the steps of:
   forming a first etching mask in a checkered pattern on a substrate;
   forming segments of multiple levels at a portion not covered by the first etching mask;
   forming a second etching mask corresponding to an inversion of the first etching mask;
   removing the first etching mask; and
   forming segments of multiple levels at a portion not covered by the second etching mask.

4. A method according to claim 1 or 3, wherein the first etching mask consists of chromium.

5. A method according to claim 1 or 3, wherein the first etching mask consists of aluminum.

6. A method according to claim 3, wherein the first etching mask consists of aluminum and wherein the second etching mask consists of chromium.

7. A method according to claim 3, wherein the first etching mask consists of chromium and wherein the second etching mask consists of aluminum.

8. A method according to claim 1 or 3, wherein the substrate comprises quartz.

9. A method according to claim 1 or 3, wherein a reticle having an optical proximity effect correcting pattern is used to form the first etching mask having a checkered pattern through photolithography.

10. A method according to claim 1 or 3, further comprising the step of:
    molding an element while using, as a mold, a substrate on which plural segments of multiple levels are formed.

11. A method according to claim 1 or 3, wherein the method is usable to produce one of a phase computer generated hologram, a two-dimensional binary structure, and a phase modulation plate.

12. An illumination system including a two-dimensional phase element manufactured in accordance with a method as recited in claim 1 or 3.

13. A projection exposure apparatus having an illumination system as recited in claim 12.

14. A device manufacturing method comprising the steps of:
    exposing a wafer to a device pattern using a projection exposure apparatus as recited in claim 13; and
    developing the exposed wafer.

* * * * *

UNITED STATES PATENT AND TRADEMARK OFFICE
CERTIFICATE OF CORRECTION

PATENT NO. : 6,803,154 B1
DATED : October 12, 2004
INVENTOR(S) : Ichiro Tanaka

It is certified that error appears in the above-identified patent and that said Letters Patent is hereby corrected as shown below:

Drawings,
Sheet 10, Figure 22, "DESINGN" should read -- DESIGN --.

Column 4,
Line 25, "view" should read -- views --;
Line 45, "width" should read -- width of --; and
Line 59, "a" should read -- an --.

Column 5,
Line 51, "thickness" should read -- thickness of --.

Column 6,
Lines 16 and 24, "depth" should read -- depth of --;
Line 34, "depth" should read -- depth.of --; and
Line 56, "fox" should read -- for --.

Column 7,
Line 26, "in" should read -- with --;
Line 60, "a" should read -- an --; and
Line 66, "the" should be deleted.

Column 8,
Line 4, "a" should read -- an --.

Signed and Sealed this

First Day of February, 2005

JON W. DUDAS
*Director of the United States Patent and Trademark Office*